United States Patent [19]

Foo et al.

[11] Patent Number: 5,616,518

[45] Date of Patent: Apr. 1, 1997

[54] PROCESS FOR FABRICATING INTEGRATING CIRCUITS

[75] Inventors: Pang-Dow Foo, Berkeley Heights; Chien-Shing Pai, Bridgewater, both of N.J.

[73] Assignee: Lucent Technologies Inc., Murray Hill, N.J.

[21] Appl. No.: 333,900

[22] Filed: Nov. 3, 1994

Related U.S. Application Data

[63] Continuation of Ser. No. 121,954, Sep. 15, 1993, abandoned, which is a continuation of Ser. No. 808,950, Dec. 13, 1991, abandoned, which is a continuation of Ser. No. 589,466, Sep. 27, 1990, abandoned.

[51] Int. Cl.$^6$ ............................................. H01L 21/441
[52] U.S. Cl. .................................. 438/680; 438/685
[58] Field of Search ................................. 437/192, 200, 437/195, 187, 190; 148/DIG. 147

[56] References Cited

U.S. PATENT DOCUMENTS

| | | | |
|---|---|---|---|
| 3,798,145 | 3/1974 | Fournier. | |
| 4,310,567 | 1/1982 | Tabata et al. | 437/245 |
| 4,570,328 | 2/1986 | Price et al. | 437/193 |
| 4,724,159 | 2/1988 | Yamazaki | 427/45.1 |
| 4,737,379 | 4/1988 | Hudgens et al. | 437/234 |
| 4,808,554 | 2/1989 | Yamazaki | 437/101 |
| 4,830,891 | 5/1989 | Nishitani et al. | 427/253 |
| 4,897,709 | 1/1990 | Yokoyama et al. | 437/190 |
| 4,918,031 | 4/1990 | Flamm et al. | 437/225 |
| 4,943,345 | 7/1990 | Asmussen et al. | 204/192.32 |
| 5,124,014 | 6/1992 | Foo et al. | 427/47 |
| 5,149,672 | 9/1992 | Lifshitz et al. | 437/189 |

OTHER PUBLICATIONS

Yokoyama et al. "LPCVD TiN as Barrier Layer in VLSI"; J. Electrochem. Soc., vol. 136 No. 3, Mar. 89; pp. 882–883.
Buiting et al "Kinetical of LPCVD of Titanium Nitride from Titanium Tetrachloride and Ammonia"; J. Electrochem. Soc.; vol. 138, No. 2, Feb. 1991, pp. 500–505.
The Effect of Reactant Gas Composition on the PECVD of TiN pp. 57–68; Jang et al., Thin Solid Films 169, 1989.
Silicon Processing for the VLSI ERA, vol. 1, Wolf et al. pp. 191–194; 1986.
Thin Film Processing; 1978; Hollahan et al.; pp. 342–351.
Handbook of Thin Film Tech.; McGraw–Hill; 1985 pp. 1.71–1.73; edited by Maissel et al.
Low Temp. CVD Method Utilizing an ECR Plasma; Matsuo et al.; vol. 22 No. 4; Apr. 1983; pp. 210–212.
H. V. Seefeld, et al., *IEEE Transactions on Electron Devices*, vol. ED–27, No. 4, Apr. 1980, "Investigation of Titanium-–Nitride Layers for Solar–Cell Contacts," p. 873.
D. H. Jang et al., *Thin Solid Films*, 169, 1989, "The Effect of Reactant Gas Composition on the Plasma–Enhanced Chemical Vapour Depositon of $T_xN$," pp. 57–68.

*Primary Examiner*—Michael Trinh
*Attorney, Agent, or Firm*—Bruce S. Schneider

[57] ABSTRACT

Integrated circuits employing titanium nitride are significantly improved by using a specific method for formation of the titanium nitride in the device fabrication. In particular, a plasma such as one formed in an electron cyclotron resonance apparatus is employed to dissociate a source of nitrogen and a source of hydrogen and the dissociation products are combined at the integrated circuit deposition substrate with titanium tetrachloride. The resulting deposition is essentially devoid of chlorine and has advantageous step-coverage properties.

9 Claims, 2 Drawing Sheets

PROCESS FOR FABRICATING INTEGRATING CIRCUITS

This application is a continuation of application Ser. No. 08/121,954, filed on Sep. 15, 1993 (abandoned), which is a continuation of Ser. No. 07/808,950, filed Dec. 13, 1991 (abandoned), which is a continuation of Ser. No. 07/589,466, filed Sep. 27, 1990 (abandoned).

BACKGROUND OF THE INVENTION

1. Field of the Invention

This invention relates to integrated circuit manufacture and, in particular, manufacture of integrated circuits having a region of titanium nitride.

2. Art Background

The use of titanium nitride has been widely suggested for various applications in integrated circuit manufacture. Indeed, such use has become even more significant as design rules become smaller. (The device design role is the smallest lateral dimension for all features within the device circuit.) For example, in the manufacture of integrated circuits, titanium nitride is employed for electrical interconnections. Additionally, in integrated circuit manufacture titanium nitride is used in some approaches to form electrical contacts at junctions such as the source, drain and gain of field effect transistors.

The latter application is particularly demanding. For these contacts desirable electrical properties include a junction contact resistance less than 10 ohms/$\mu m^2$ and a junction leakage current less than $10^{-8}$ amp s/$cm^2$. Complexities inherent in strict design rules make satisfaction of these requirements significantly more difficult. For example, since the source and drain junctions are typically no deeper than 0.25 µm at submicrons design rules, any undesirable chemical reaction with the junction induced by the fabrication process quickly destroys it. Additionally, electrical contact is made through an opening in an overlying dielectric to the underlying junction region, e.g., drain or source junction region. Typically, as a consequence of strict design rules, this opening (generally referred to as a window or via) has a high aspect ratio, i.e., greater than 1.0. (Aspect ratio is defined as the thickness of the dielectric at the junction divided by the effective diameter of the via/window at the junction, i.e., the diameter of a circle having the same area as the via/window at the junction.) To contact the junction through a high aspect ratio opening requires deposition of a conductive material that conforms to or fills the opening so that the conducting cross-section in the via/window is adequate to maintain an acceptably low current density and contact resistance. Thus, in summary, to ensure a suitable contact, undesirable chemical reaction with the junction should be avoided while a coating that conforms to or fills the via/window should be produced.

One promising approach for satisfying the difficulties associated with strict design rules involves the blanket deposition of titanium nitride to cover the surface of the silicon dioxide and to form a region at the bottom of the via/window. The titanium nitride provides an adhesion layer for subsequent deposition of, for example, tungsten on the surface overlying the silicon dioxide. Additionally, this region aids in the formation of the contact to, for example, the source and drain by initiating the interface between the contact and such source or drain. Thus, in one embodiment, titanium nitride is first deposited to coat the surface of the silicon dioxide and bottom of the vias/windows through the silicon dioxide. Subsequently, tungsten is deposited by an expedient such as chemical vapor deposition from tungsten hexafluoride and a reducing agent such as hydrogen. (See Lifshitz 3–7, U.S. Patent application Ser. No. 226,917, dated Aug. 1, 1988, which is hereby incorporated by reference.)

Various methods have been developed for the deposition of titanium nitride. For example, titanium nitride is sputtered by processes such as described in P. R. Fournier, U.S. Pat. No. 3,798,145, or H. von Seefeld, et al., *IEEE Transactions Electron Devices*, 27,873 (1980). However, generally it is believed that sputtering processes do not produce a suitable conformal coating for subsequent processing. That is, the coating such as shown in FIG. 1 has extremely thin corners that typically, in subsequent metallization, produce contact failure at the bottom corners of the via/window. Additionally such configuration promotes voids in the metal filling the via or window formed during the subsequent deposition process.

Plasma deposition processes such as described by D. H. Jang, et al. *Thin Solid Films*, 169, No. 2, pp. 57–68 (1989), generally are performed at rf plasma frequencies and typically result in a deposited titanium and nitrogen containing material that includes bound chlorine. This bound chlorine is undesirable since it affords the potential for serious corrosion of metal regions of the device. Similarly the formation of titanium nitride by chemical vapor deposition (CVD) using gas precursors such as titanium tetrachloride and ammonia also leads to titanium/nitrogen materials containing bound chlorine. Thus, although titanium nitride appears to be of potential significance in the fabrication of devices, it would benefit from an improved process.

SUMMARY OF THE INVENTION

In the fabrication of an integrated circuit device, the use of a particular titanium nitride deposition step produces an appropriate essentially chlorine free conformal coating for high aspect ratio via/windows. This titanium nitride deposition step involves using titanium tetrachloride, a source of nitrogen, and a source of hydrogen in chemical vapor deposition. The source of nitrogen is introduced into a plasma environment that is sufficiently energetic to cause substantial dissociation into nitrogen atoms. The source of hydrogen is introduced either into the plasma or introduced with the titanium tetrachloride in proximity to the substrate remote from the plasma region. Nitrogen and hydrogen are maintained in excess to the titanium tetrachloride. Under these processing conditions the resulting deposition has good sidewall coverage and a chlorine content of less than 0.3 mole % (the detection limit of Rutherford backscattering). In particular, in this context, sidewall coverage is acceptable when the angle Θ(in FIG. 1) between a tangent to the sidewall at the bottom of the window/via and a line representing a least squares fit to the bottom of the via/window is greater than 85 degrees. Thus the configuration of FIG. 1 (where 10 is, for example, a titanium nitride layer and 20 is the substrate) is not acceptable and the configuration of FIG. 2 is.

DETAILED DESCRIPTION

Figure 1:
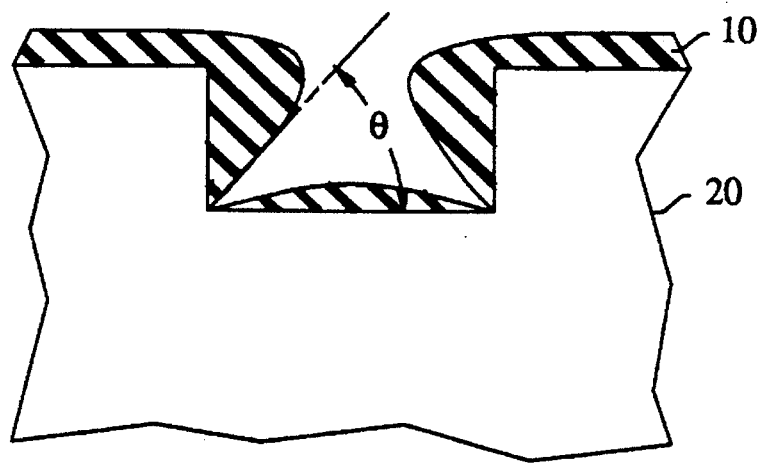
FIGS. 1 and 2 are illustrative of possible deposition configurations.
Figure 2:
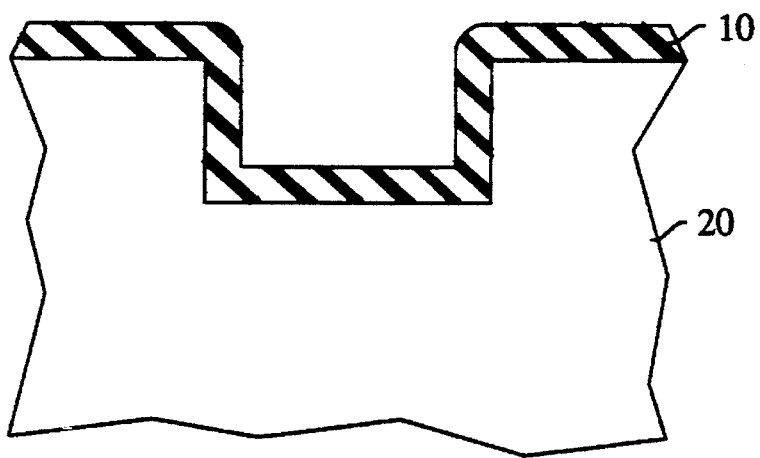

The invention involves the fabrication of an integrated circuit device where one step in such fabrication is the deposition of a titanium nitride region. In this titanium nitride deposition step, titanium tetrachloride is introduced to the deposition chamber, a source of nitrogen is introduced into a plasma chamber, and a source of hydrogen is introduced either into the plasma or to the deposition chamber. The substrate is located in the deposition chamber.

The plasma energetics should be sufficient to achieve a mole excess of nitrogen relative to titanium tetrachloride in the vicinity of the substrate. Typically a plasma based on rf frequencies, e.g. 0.5 MHz to 27 MHz in configurations such as parallel plate electrodes, is insufficiently energetic to achieve this result. Suitable plasmas are produced by techniques such as electron cyclotron resonance (ECR) or through the use of a helical resonator. (Typical ECR equipment and processes are described in U.S. Patent application Ser. No. 485,418, dated Feb. 27, 1990 (Foo, et al), while helical resonators are described in U.S. Pat. No. 4,918,031 dated Apr. 17, 1990 (Flamm, et al) both of which are hereby incorporated by reference.) For example, in an ECR apparatus typically a microwave frequency of between 2.45 GHz and 915 MHz is employed. In addition to this microwave frequency a magnetic field at right angles to the direction of propagation of the microwave radiation is also utilized. Generally a magnetic field having a strength in the range 875 to 327 Gauss is used. Similarly, for helical resonators generally frequencies in the range 7 MHz to 27 MHz yield the desired dissociation of the source of nitrogen to produce nitrogen atoms.

Sufficient hydrogen should be present to be in mole excess to titanium tetrachloride. Therefore, at least two moles of molecular hydrogen should be present for every mole of titanium tetrachloride. In an advantageous embodiment at least 3 moles of molecular hydrogen should be present relative to each mole of titanium tetrachloride. (For purposes of this criterion two moles of atomic hydrogen are considered equivalent to one mole of molecular hydrogen.) Generally when the total partial pressure of titanium tetrachloride, the source of hydrogen, and the source of nitrogen are in the range from $10^{-4}$ to 2 mTorr, suitable deposition and absence of chlorine is obtained. At higher pressures in the range up to 50 mTorr suitable deposition and chlorine contents are obtained by employing a bias on the substrate relative to ground. Generally, a bias is used in the range 0 to 500 volts where the necessary bias increases with the pressure employed. The pressure given is in the absence of an inert gas. However, the use of an inert gas such as argon is not precluded, and if an inert gas is utilized, appropriately increased pressures are useful.

The deposition rate achieved is primarily dependent on the total concentration of the reactants and on the power introduced into the plasma. Generally deposition rates in the range 200 Å/min to 600 Å/min are obtained for microwave power in the range 500 W to 1000 W in conjunction with the previously discussed pressures. Typically, the higher the power and the greater the concentration, the faster the deposition rate. However, since typically a titanium nitride layer of 1200 Å or less is utilized in the device, deposition rate is generally not critical. Generally, power densities in the range 600 W to 800 W are employed. The flow rate of the reactants is not critical and is generally in the range 15 sccm to 100 sccm.

The source of nitrogen and the source of hydrogen need not be separate. For example, gases such as ammonia provide both a source of nitrogen and a source of hydrogen. Alternatively, a suitable source of nitrogen is molecular nitrogen and a suitable source of hydrogen is molecular hydrogen. Typical gas handling techniques as described in Foo, et al., supra, are utilized to introduce these gases at appropriate pressures and flow rates.

The temperature of the deposition substrate does not substantially affect the concentration of chlorine present in the deposition or the conformation of the deposition. Typically deposition substrate temperatures in the range from 23° C. to 500° C. are employed. Temperatures greater than 500° C. are not desirable because they exceed the melting point of aluminum and lead to destruction of device structures formed from this metal while temperatures less than 23° C. are not advantageous because the relatively low vapor pressure of the precursor at this temperature limits the deposition rate.

The following examples are illustrative of conditions suitable for the titanium nitride deposition step of the inventive process.

EXAMPLE 1

Silicon wafers were prepared having oxide windows/vias formed on the upper surface. The oxide was prepared by CVD with a tetraethoxysilane precursor, had a thickness of 1 μm, and a window diameter of about 0.9 μm which were formed by conventional lithographic exposure and development followed by oxide dry etching. The wafers were placed in a ECR reactor and deposited with titanium nitride using TiCl$_4$ precursor gas. For this deposition, the microwave frequency was 2.45 GHz, the substrate temperature was 300° C., the microwave power was 650 W, the TiCl$_4$ flow rate was 2 sccm, the N$_2$ flow rate was 5 sccm, and the H$_2$ flow rate was 15 sccm. The deposition pressure was maintained at 2.3 mTorr.

EXAMPLE 2

The procedure of Example 1 was followed except an rf frequency of 13.56 MHz was applied to the substrate. The rf power was 140 W, the TiCl$_4$ flow rate was 4 sccm, the N$_2$ flow rate was 10 sccm, and the H$_2$ flow rate was 30 sccm. The deposition pressure was 3 mTorr.

EXAMPLE 3

The procedure of Example 1 was followed except the rf bias was 400 W, the TiCl$_4$ flow rate was 4 sccm, the N$_2$ flow rate was 10 sccm, the H$_2$ flow rate was 30 sccm, and an Ar flow rate of 50 sccm was also employed. The deposition pressure was 26 mTorr.

Figure 3:
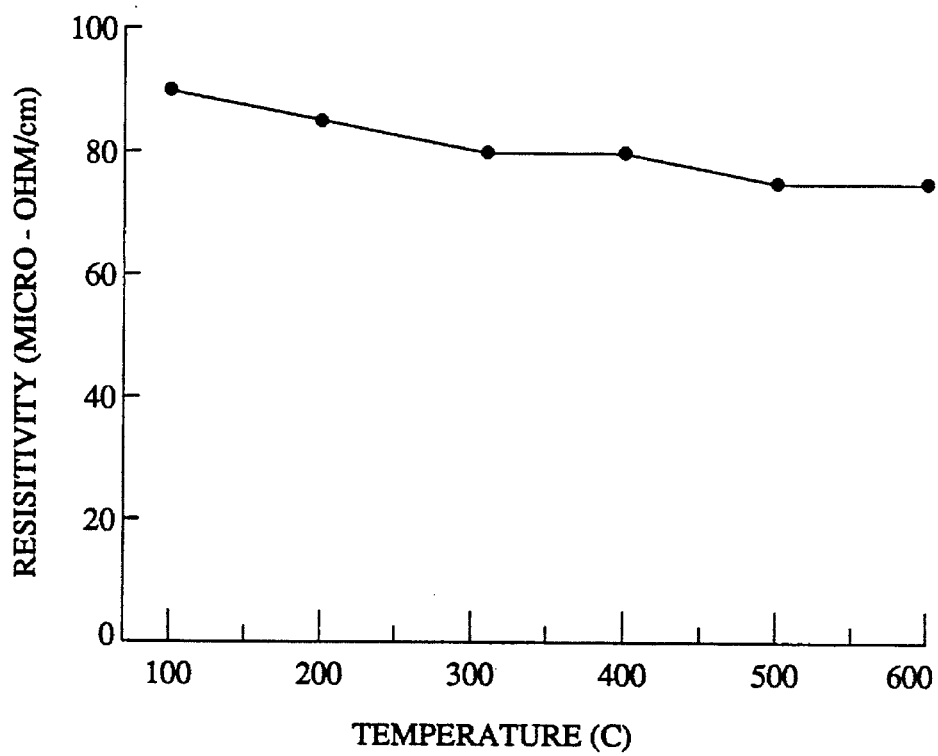
FIGS. 3 and 4 are illustrative of results involved in the invention.
Figure 4:
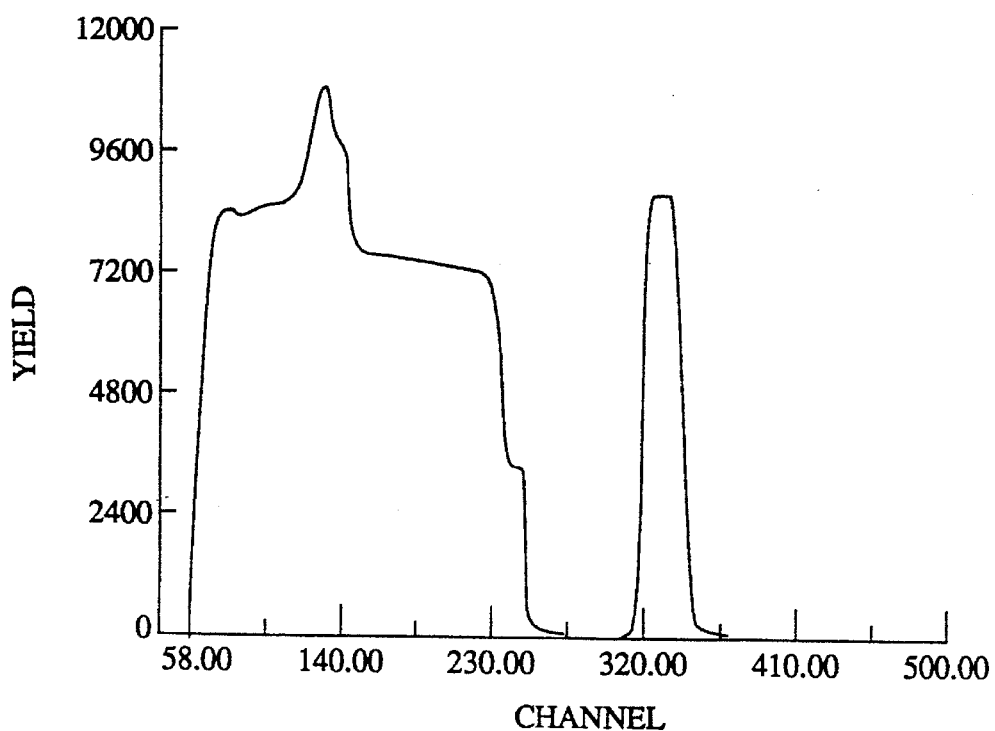

The processes of Examples 1, 2 and 3 provided titanium nitride layers having resistivity at below 120 μohm-cm and as low as 60 μohm-cm. The deposition rate was between 250 to 500 Å/min and the chlorine content was less than 0.3% (below the Rutherford back scattering detection limit). The actual data for resistivity and chlorine content for the film of Example 1 is shown in FIGS. 3 and 4, respectively.

What is claimed is:

1. A process of fabricating a device comprising the steps of forming an opening in a material layer overlying a substrate and forming titanium nitride in said opening characterized in that said forming of said titanium nitride comprises introducing titanium tetrachloride within the vicinity of said substrate and reacting said titanium tetrachloride at a temperature between 23° and 500° C. with a mole excess of atomic nitrogen produced in a plasma formed by an electron cyclotron resonator or a helical resonator, and with hydrogen whereby said titanium nitride is essentially devoid of chlorine.

2. The process of claim 1 wherein said atomic nitrogen is formed by introducing a source of nitrogen into a discharge formed in an apparatus chosen from the group consisting of electron cyclotron resonance and a helical resonator.

3. The process of claim 2 wherein said source of nitrogen comprises molecular nitrogen.

4. The process of claim 2 wherein said source of nitrogen comprises ammonia.

5. The process of claim 1 wherein said atomic nitrogen and said hydrogen is produced from the same source.

6. The process of claim 5 wherein said source comprises ammonia.

7. The process of claim 1 wherein said opening allows electrical contact to a region underlying said layer.

8. The process of claim 7 wherein said region comprises a source or drain of a field effect transistor.

9. The process of claim 1 wherein said material comprises silicon dioxide.

* * * * *